United States Patent
Lee et al.

(10) Patent No.: US 6,887,137 B2
(45) Date of Patent: May 3, 2005

(54) CHEMICAL MECHANICAL POLISHING SLURRY AND CHEMICAL MECHANICAL POLISHING METHOD USING THE SAME

(75) Inventors: Jae-dong Lee, Suwon (KR); Bo-un Yoon, Sungnam (KR); Yong-pil Han, Ann Arbor, MI (US)

(73) Assignee: Samsung Electronics Co., Ltd. (KR)

(*) Notice: Subject to any disclaimer, the term of this patent is extended or adjusted under 35 U.S.C. 154(b) by 76 days.

(21) Appl. No.: 10/378,102

(22) Filed: Feb. 28, 2003

(65) Prior Publication Data

US 2003/0166381 A1 Sep. 4, 2003

(30) Foreign Application Priority Data

Feb. 28, 2002 (KR) .............................. 10-2002-0010928

(51) Int. Cl.[7] .............................................. C09K 13/00
(52) U.S. Cl. .......................... 451/57; 451/41; 451/288; 252/79.1; 252/79.2; 252/79.3; 51/106; 51/307; 51/308; 51/309; 438/690; 438/692; 156/653.1
(58) Field of Search .......................... 451/41, 57, 532, 451/539, 921, 285–290; 252/79.1–79.5; 51/106, 306, 307–309; 438/690, 692, 693; 156/653.1, 654.1

(56) References Cited

U.S. PATENT DOCUMENTS

| | | | | |
|---|---|---|---|---|
| 5,759,917 A | * | 6/1998 | Grover et al. .............. | 438/690 |
| 5,958,794 A | * | 9/1999 | Bruxvoort et al. .......... | 438/692 |
| 6,042,741 A | * | 3/2000 | Hosali et al. .............. | 252/79.1 |
| 6,238,592 B1 | * | 5/2001 | Hardy et al. ............... | 252/79.1 |
| 6,316,365 B1 | * | 11/2001 | Wang et al. ................ | 438/692 |
| 6,540,935 B2 | * | 4/2003 | Lee et al. .................. | 252/79.1 |

* cited by examiner

Primary Examiner—Lee D. Wilson
Assistant Examiner—Anthony Ojini
(74) Attorney, Agent, or Firm—F. Chau & Associates LLC; Frank V. DeRosa (57) ABSTRACT

Slurries for chemical mechanical polishing (CMP) are provided including a high planarity slurry and high selectivity ratio slurry. A high planarity slurry includes at least one kind of metal oxide abrasive particle and an anionic polymer passivation agent having a first concentration. A high selectivity ratio slurry includes at least one kind of the metal oxide abrasive particle, the passivation agent in a second concentration that is less than the first concentration of the passivation agent for the high planarity slurry, one of a quaternary amine and the salt thereof, and a pH control agent. The high selectivity ratio slurry has a pH in a range of about over an isoelectric point of a polishing target layer and less than an isoelectric point of a polishing stopper. In addition, a CMP method using the CMP slurries having high planarity and high selectivity ratio is provided.

53 Claims, 9 Drawing Sheets

Equation 1

Fig. 15(a)

Equation 2

Fig. 15(b)

CHEMICAL MECHANICAL POLISHING SLURRY AND CHEMICAL MECHANICAL POLISHING METHOD USING THE SAME

CROSS-REFERENCE TO RELATED APPLICATION

This application claims priority to Korean Patent Application No. 2002-10928 filed on Feb. 28, 2002, which is fully incorporated herein by reference.

TECHNICAL FIELD OF THE INVENTION

The present invention generally relates to CMP (chemical/mechanical polishing) slurries for use in the manufacture of microelectronic devices. More particularly, the present invention relates to CMP slurries that can rapidly remove a target layer and effectively passivate a polishing stopper, with high selectivity.

BACKGROUND

Semiconductor devices have become increasingly more integrated and smaller with multilayered interconnections and consequently, the amount of processing steps have increased to form multiple conductive layers or insulating layers on a wafer. To eliminate steps in semiconductor device fabrication, CMP is commonly used, which is a combination of chemical and mechanical processes. CMP was developed in the late 1980s by International Business Machines Corporation. Since its introduction, CMP has been applied as a core micro-processing technique at almost all stages of fabrication of 64 Mbit or greater memory and non-memory devices. Currently, CMP is receiving great consideration for use in the fabrication of next generation gagibit level DRAM memories or equivalent level non-memory devices.

CMP is a type of planarization process. In CMP, a wafer surface having irregularities is pressed against a rotating polishing pad, while an abrasive slurry is made to flow to a contact area of the wafer and polishing pad. CMP planarizes the irregular wafer surface by means of chemical and physical reactions. The performance of CMP is determined by factors such as the operating conditions of a CMP apparatus, the type of slurry, and the type of polishing pad.

Among such factors, the type of slurry that is used for CMP is the most critical factor affecting polishing performance. It is preferable for a CMP slurry to provide high planarity and a high selectivity ratio. However, conventional slurries that provide insufficient planarity generate dishing on a CMP processed surface, which can cause short-circuits between interconnects. Moreover, with conventional CMP slurries, which are used in the formation of shallow trench isolation (STI) or the formation of an interlayer dielectric (ILD) layer, wherein a self-aligned contact hole exposing a source/drain region of a DRAM is formed, the selectivity of a target layer to be polished (e.g., an oxide layer) with respect to a polishing stopper (e.g., a silicon nitride layer) is at a ratio of 4:1, which is considered a poor selectivity. As a result, the polishing stopper is excessively polished. To combat excessive polishing of the stopper, the thickness of the polishing stopper must be increased. Further, with conventional slurries, the polishing stopper remaining after the CMP has thickness variations, which results in an uneven wafer surface and reduces a margin for subsequent device manufacturing processes. As a result, the characteristics of the semiconductor device can degrade. Accordingly, there is a need for CMP slurries that provide high planarity and high selectivity.

SUMMARY OF THE INVENTION

It is an objective of the present invention to provide a chemical mechanical polishing (CMP) slurry having high planarity and/or high selectivity ratio characteristics.

It is another objective of the present invention to provide a CMP method using a CMP slurry having high planarity and/or high selectivity ratio characteristics.

To accomplish the above objectives, the CMP slurry according to the present invention comprises a slurry kit, which comprises a high planarity slurry and a high selectivity ratio slurry. The slurry kit is used for a CMP process of a substrate having a polishing stopper and a polishing target layer that covers the polishing stopper. The high planarity slurry includes an aqueous solution comprising at least one kind of metal oxide abrasive particle and an anionic polymer passivation agent in a first concentration. The high selectivity ratio slurry includes an aqueous solution comprising at least one kind of metal oxide abrasive particle and the passivation agent in a second concentration, wherein the second concentration is less than the first concentration, and having a pH (potential of hydrogen) in a range of about over an isoelectric point of the polishing target layer to about less than an isoelectric point of a polishing stopper. The high selectivity ratio slurry may be used independently.

It is preferable that the passivation agent comprises one of polycarboxylic acid, polyethylenimine, polyvinyl sulfonic acid, polycarboxylate, polyethyleniminate, and polyvinyl sulfonate.

The high planarity slurry preferably includes about 1.6 to about 4.0%, and more preferably about 1.6 to about 2.1%, by weight of the passivation agent based on the total weight of the high planarity slurry. It is preferable that the high selectivity ratio slurry includes about 0.4 to about 1.2% by weight of the passivation agent based on the total weight of the high selectivity ratio slurry.

It is preferable that the abrasive particles comprise one of ceria, silica, alumina, titania, zirconia, germania, and any combination thereof to the amount of 0.5 to 2.0% by weight of the abrasive particles.

The high selectivity ratio slurry may further comprise one of a quaternary amine, a salt thereof, and a derivative thereof and/or a pH control agent. The quaternary amine comprises one of tetra methyl ammonium hydroxide and choline to the amount of 0.2 to 0.8% by weight, preferably. The pH control agent comprises one of potassium hydroxide, ammonium hydroxide, tetra methyl ammonium hydroxide, and choline. It is preferable the pH of the high selectivity ratio slurry is in a range from about 5 to about 9. It is more preferable that the pH of the high selectivity ratio slurry is in a range from about 7 to about 9.

It is preferable that the polishing target layer is an oxide layer and the polishing stopper is a silicon nitride layer.

In another embodiment of the invention, a CMP method is provided for removing at least a portion of a polishing target layer on the surface of a substrate having a polishing stopper and the polishing target layer that covers the polishing stopper by rotatably contacting the substrate to a polishing pad while delivering a high planarity slurry to a gap between the substrate and the polishing pad, wherein the high planarity slurry includes at least one kind of metal oxide abrasive particle and anionic polymer passivation agent in a first concentration. Thereafter, the substrate is rotatably contacted to the polishing pad while delivering a high selectivity ratio slurry to a gap between the substrate and the polishing pad, wherein the high selectivity ration slurry includes at least one kind of the metal oxide abrasive particle and the passivation agent in a second concentration, which is less than the first concentration, wherein a pH of the slurry is in a range of about over an isoelectric point of the polishing target layer to about less than an isoelectric point of the polishing stopper, to thereby removing the polishing target layer until the surface of the polishing stopper is exposed. The process of using the high planarity slurry may be selectively omitted.

In one embodiment, the polishing target layer is a trench buried dielectric or an interlayer dielectric formed on the substrate having lower structures. It is preferable that the polishing target layer is an oxide layer and the polishing stopper is a silicon nitride layer. It is more preferable that the oxide layer comprises an HDPCVD or PECVD oxide layer and the silicon nitride layer comprises an LPCVD or high temperature PECVD silicon nitride layer.

BRIEF DESCRIPTION OF THE DRAWINGS

The above objective and advantages of the present invention will become more apparent by describing in detail preferred embodiments thereof with reference to the accompanying drawings in which:

FIG. 15$a$ is a diagram illustrating a chemical reaction that forms negatively charged polymers; and FIG. 15$b$ is a diagram illustrating disassociation of an anionic polymer passivation agent in an aqueous solution.

DETAILED DESCRIPTION OF PREFERRED EMBODIMENTS

Chemical/mechanical polishing (CMP) slurries according to various embodiments of the invention, and CMP methods using such slurries, will now be described more fully with reference to the accompanying drawings. It is to be understood that the invention may be embodied in many different forms and that the embodiments described herein should not be construed as placing any limitation on the scope of the invention. Indeed, exemplary embodiments are provided so that this disclosure will be thorough and complete, and will fully convey the concept of the invention to those having ordinary skill in the art. In the drawings, the thickness of layers and regions are exaggerated for clarity. The same reference numerals in different drawings represent the same or similar elements.

As discussed in detail below, characteristics of CMP slurries according to the present invention are adjusted by varying the concentration of certain additives such as metal oxide abrasive particles. CMP slurries according to the invention have varying characteristics and may be used independently or complementarily based on the application. For instance, CMP slurries according to the present invention include slurries that provide a high selectivity ratio and slurries that provide high planarity. As explained in further detail below, a slurry that provides high planarity is obtained when a large amount of a passivation agent is added to at least one kind of metal oxide abrasive particle. Further, a slurry that provides a high selectivity ratio is obtained when a small amount of the passivation agent is added to metal oxide abrasive particles.

A CMP slurry according to one embodiment of the invention that provides high selectivity ratio includes an aqueous solution of (i) metal oxide abrasive particles preferably in a range of about 0.2 to about 2.5%, and more. preferably about 0.5 to about 2.0%, by weight based on the total weight of the slurry (hereafter, wt %), (ii) an anionic polymer passivation agent in a range of about 0.4 to about 1.2 wt % and (iii) a balance of water, preferably deionized water.

It is preferable that the metal oxide abrasive particles comprise ceria, silica, alumina, titania, zirconia, germania, or similar materials, or mixtures of the forgoing materials.

Figure 15A:
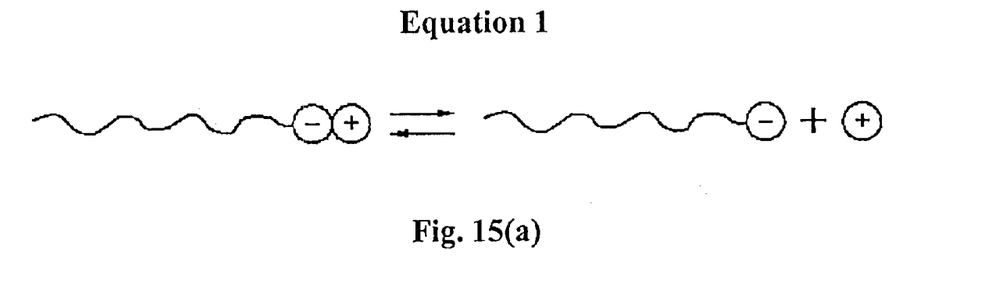

The anionic polymer passivation agent is preferably a material selected from a group consisting of polycarboxylic acid, polyethylenimine, polyvinyl sulfonic acid, polycarboxylate, polyethyleniminate, and polyvinyl sulfonate. The anionic polymer passivation agent is dissolved in the aqueous solution to form a large amount of negatively charged polymers as shown in Equation 1 of FIG. 15($a$). The negatively charged polymers are strongly adsorbed onto a positively charged surface by electrostatic attraction, and an electrostatic repulsive force occurs between the negatively charged polymers and a negatively charged surface. In other words, the anionic polymers are adsorbed onto the positively charged surface in the slurry to perform a passivation operation. As a result, the polymers restrain the polishing of a positively charged material in the slurry, while selectively polishes a negatively charged material.

Consequently, when two different layers are charged with different polarities, a selectivity ratio is improved by the passivation operation of the anionic polymers. If the potential of hydrogen (pH) of the slurry is lower than an isoelectric point, the surface of the layer in the slurry is positively charged. If the pH of the slurry is higher than the isoelectric point, the surface of the layer is negatively charged. Accordingly, the layers can be charged with different polarities by adjusting the pH of the slurry.

Figure 1:
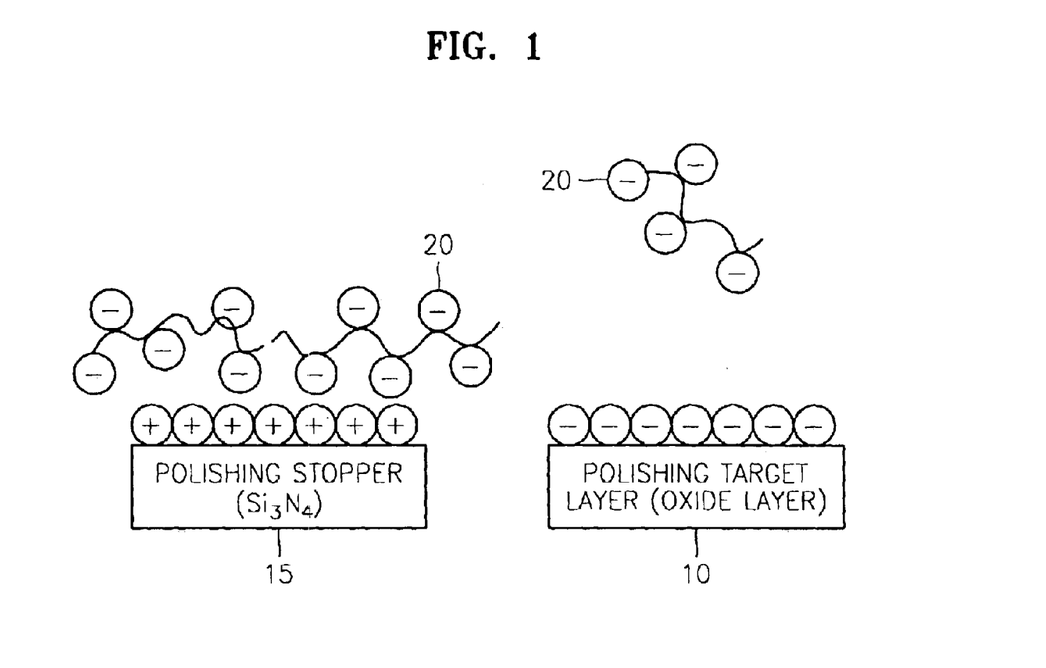
FIG. 1 is a schematic view depicting a passivation mechanism of an anionic polymer passivation agent.

More specifically, referring to FIG. 1, when the pH of the slurry is in a range between the isoelectric points of a polishing target layer 10, e.g., oxide layer, and a polishing stopper 15, e.g., silicon nitride layer, the polishing target layer 10 is negatively charged while the polishing stopper 15 is positively charged. Consequently, anionic polymers 20 are strongly adsorbed onto the surface of the polishing stopper 15 to perform the passivation operation. Accordingly, a high selectivity ratio of the polishing target layer 10 to the polishing stopper 15 is obtained, namely 45:1, from the passivation operation of the anionic polymers 20.

Preferably, an oxide layer (which is used as a polishing target layer for shallow trench isolation (STI) and interlayer dielectric (ILD) processes according to the invention) is a high-density plasma (HDP) oxide layer formed by a high density plasma chemical vapor deposition (HDPCVD) method or a plasma enhanced tetraethylorthosilicate (PE-TEOS) formed by a plasma enhanced chemical vapor deposition (PECVD) method. Further, a silicon nitride layer (which is used as a polishing stopper) is formed by a low pressure chemical vapor deposition (LPCVD) method performed under a pressure of less than hundreds m torr or a PECVD method performed at a high temperature of about 500 to 600° C.

Figure 2:
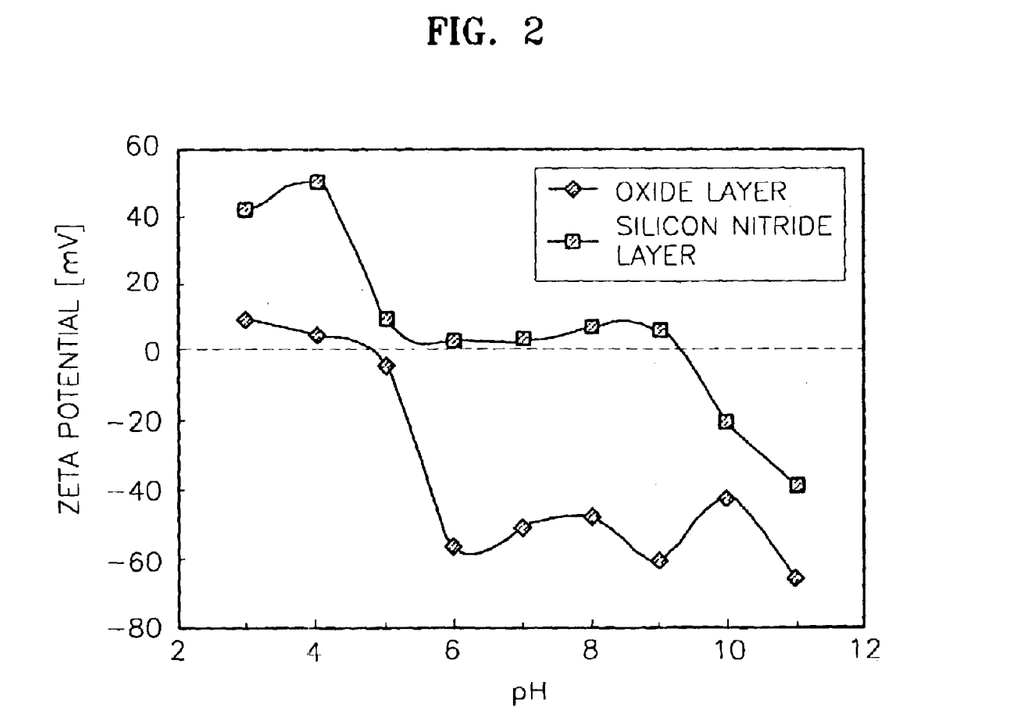
FIG. 2 is a graph illustrating the zeta potentials of a silicon oxide layer and a silicon nitride layer according to the potential of hydrogen (pH)

The intrinsic surface charges of the layers are represented by a zeta ($\zeta$) potential value (mV), and the pH of the aqueous solution, at which the signs of the zeta potentials switch, is the isoelectric point. For example, as shown in FIG. 2, in the case of a HDPCVD or PECVD oxide layer, the isoelectric point is at about pH 5. In the case of a LPCVD or high temperature PECVD silicon nitride layer, the isoelectric point is at about pH 9. Accordingly, the pH of the slurry is preferably in a range from about 5 to about 9, and more preferably in a range from about 7 to about 9, to sufficiently represent opposite surface charges on both layers.

It is preferable that a high selectivity ratio slurry according to the invention comprises about 0.2 to about 0.8 wt % of quaternary amine, a salt thereof, or a derivative thereof (which are, hereinafter, collectively referred to as quaternary amines). It is preferable that a quaternary amine comprises tetra methyl ammonium hydroxide (($CH_3$)$_4$NOH, TMAH), choline (($CH_3$)$_3$($CH_2CH_2OH$)NOH), or salts thereof. The salt or derivative of the choline is preferably a material selected from a group consisting of choline fluoride, choline chloride, choline bromide, choline iodide, choline dihydrogen citrate, choline bitartrate, choline bicarbonate, choline citrate, choline ascorbate, choline borate, choline theophyllinate, choline gluconate, acethylcholine chloride, acethylcholine bromide, and methacholine chloride.

Figure 15B:
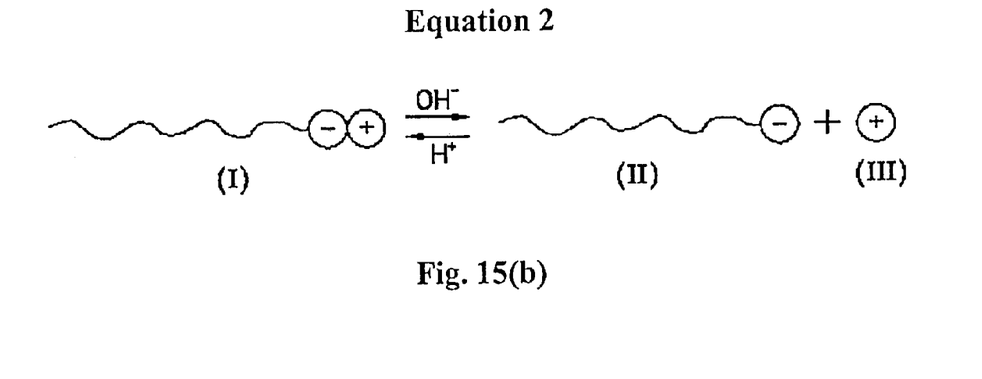

The quaternary amine enhances the oxide layer removal rate of the slurry by its oxide layer removal characteristic as well as adjusting the pH of the slurry into an optimal range. In addition, a basic quaternary amine promotes the dissociation of the anionic polymer passivation agent I as shown in Equation 2 of FIG. 15(b).

The anionic polymer passivation agent I is disassociated in the aqueous solution to form the negatively charged polymer II and positive charges III. In this case, the anionic polymer passivation agent I is not completely disassociated in the aqueous slurry but disassociated while balancing solution equilibrium. If a base is added, such as basic quaternary amine, the anionic polymer passivation agent I is additionally disassociated by the reaction of conjugated acid—conjugated base to generate a larger amount of the anionic polymers II. Accordingly, the passivation operation for the polishing stopper is enhanced.

In another embodiment, a high selectivity ratio slurry may further include a pH control agent to optimize the pH of the slurry. For instance, a pH control agent may comprise a base material selected from a group consisting of potassium hydroxide (KOH), ammonium hydroxide ($NH_4OH$), TMAH, and choline, or an acid material selected from a group consisting of sulfuric acid, hydrochloric acid, phosphoric acid, and nitric acid.

A high planarity slurry according to an embodiment of the invention comprises an aqeuous solution comprising a greater amount of anionic polymer passivation agent as compared to a high selectivity ratio slurry according to an embodiment of the invention. For example, in one embodiment, a high planarity slurry preferably comprises an aqueous solution comprising about 0.2 to about 2.5 wt % of metal oxide abrasive particles and about 1.6 to about 4.0 wt % of an anionic polymer passivation agent. More preferably, a high planarity slurry comprises an aqueous solution comprising about 1.6 to about 2.1 wt % of an anionic polymer passivation agent. Various factors are considered for the amount of additives of the slurry such as production costs of the slurry and the minimum removal rate of the polishing target layer.

When the amount of the anionic polymer passivation agent increases, in addition to operating as a passivation agent, the anionic polymers disassociated in the aqueous slurry exist in a bulk phase, which restrains the activation of the abrasive particles and affects the fluidity of the slurry. Accordingly, if steps exist on a wafer surface to which the polishing process is applied, a high step portion will be rapidly removed and a low step portion will be slowly removed using a high planarity slurry according to the invention. As a result, the surface of the wafer, to which the high planarity slurry is applied, represents high planarity.

In another embodiment, a high planarity slurry may further comprise a pH control agent to optimize the pH of the slurry. For instance, a pH control agent may comprise a base material selected from a group consisting of potassium hydroxide (KOH), ammonium hydroxide ($NH_4OH$), TMAH, and choline hydroxide, or an acid material selected from a group consisting of sulfuric acid, hydrochloric acid, phosphoric acid, and nitric acid.

A method for manufacturing a high selectivity ratio slurry according to an embodiment of the present invention will now be described with reference to FIG. 3. Initially, abrasive particles as a raw material of the slurry are input to a high shear mixer having deionized water (S30). Then, the deionized water and the abrasive particles are preliminarily mixed (S32). In the preliminary mixing (S32), the concentration of the abrasive particles is preferably maintained in a range of about 0.2 to about 2.5 wt %, and more preferably in a range of about 0.5 to about 2.0 wt % based on the total weight of the final slurry. In the preliminary mixing step, it is preferable that the pH of the slurry is adjusted to be in either a weak acid range or weak alkali range.

The mixed slurry is delivered to proper dispersion equipment, such as a media mill or ultra-high pressure dispersion equipment, using a pump and then thoroughly dispersed under high pressure (S34). Although it is possible to use any type of dispersion equipment, a ultra-high pressure dispersion equipment is preferably selected based on various factors such as the reproducibility of dispersion capacity, the minimization of contamination in a dispersion process, and average particle size and dispersibility after dispersion. Considering durability, it is preferable that an ultra hard dispersion chamber, which is the core part of the ultra-high pressure dispersion equipment, is formed of diamond. It is preferable that the slurry is dispersed under the pressure range of about 10,000 to about 20,000 psi. If the pressure is lower than this pressure range, the dispersion efficiency becomes too low. If the pressure is greater than this range, it adversely affects the efficiency of the equipment and the durability of the chamber.

After the average slurry particles size is controlled by the ultra-high pressure dispersion, the concentration of the abrasive particles may be adjusted by adding deionized water.

When the average slurry particle size control process of the slurry is completed by the ultra-high pressure dispersion, additives required for the characteristics of the slurry are added (S36). In particular, an amount of about 0.4 to about 1.2 wt % of an anionic polymer passivation agent is added to improve the selectivity ratio of the slurry. Preferably, an anionic polymer is a material selected from a group consisting of polycarboxylic acid, polyethylenimine, polyvinyl sulfonic acid, polycarboxylate, polyethyleniminate, and polyvinyl sulfonate.

A quaternary amine is preferably added to increase the selectivity ratio of the slurry while setting the pH of the slurry into an optimal range. Preferably, an amount of about 0.2 to about 0.8 wt % of the quaternary amine is added. By adding the quaternary amine, the pH of the slurry is controlled to be higher than the isoelectric point of a polishing target layer and lower than the isoelectric point of a polishing stopper. In the case where the polishing target layer is an oxide layer and the polishing stopper is a nitride layer, the pH of the slurry is adjusted to be preferably in a range from about 5 to about 9, and more preferably in a range from about 7 to about 9.

If the optimum pH of the slurry is not obtained by adding the quaternary amine, a pH control agent is preferably added for setting the pH of the slurry.

When the addition and/or pH control process for the slurry is completed, a slurry filtration process is performed using a filter to rapidly remove relatively large particles (S38). The slurry filtration process removes the large particles from the slurry to reduce scratches on the polishing target layer. After the slurry filtration process, various physical properties and performance characteristics of the slurry are tested.

It is to be understood that a high planarity slurry according to an embodiment of the invention can be made using the same processes as discussed above for a high selectivity ratio slurry, but with changes to the amounts of additives.

A high selectivity ratio slurry and a high planarity slurry according to the present invention may be used independently or successively.

Figure 4:
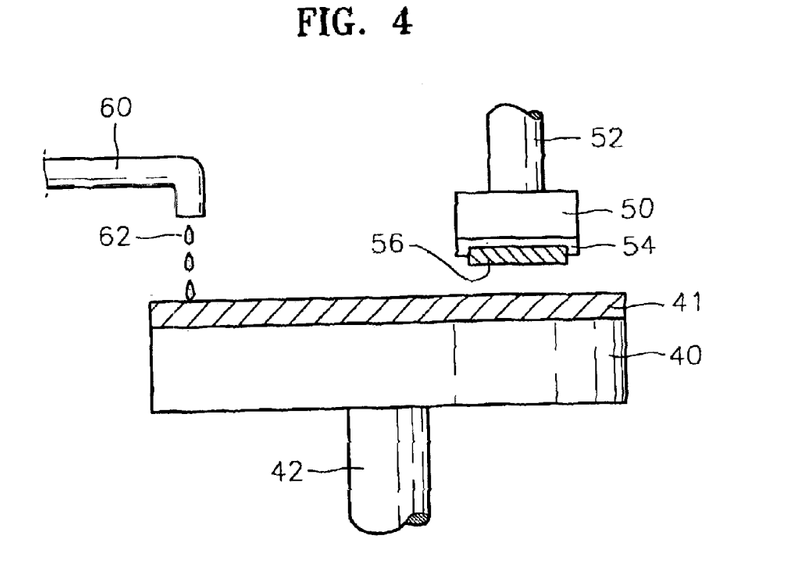
FIG. 4 is a schematic view depicting an apparatus used for performing a CMP process according to the present invention.
Figure 5:
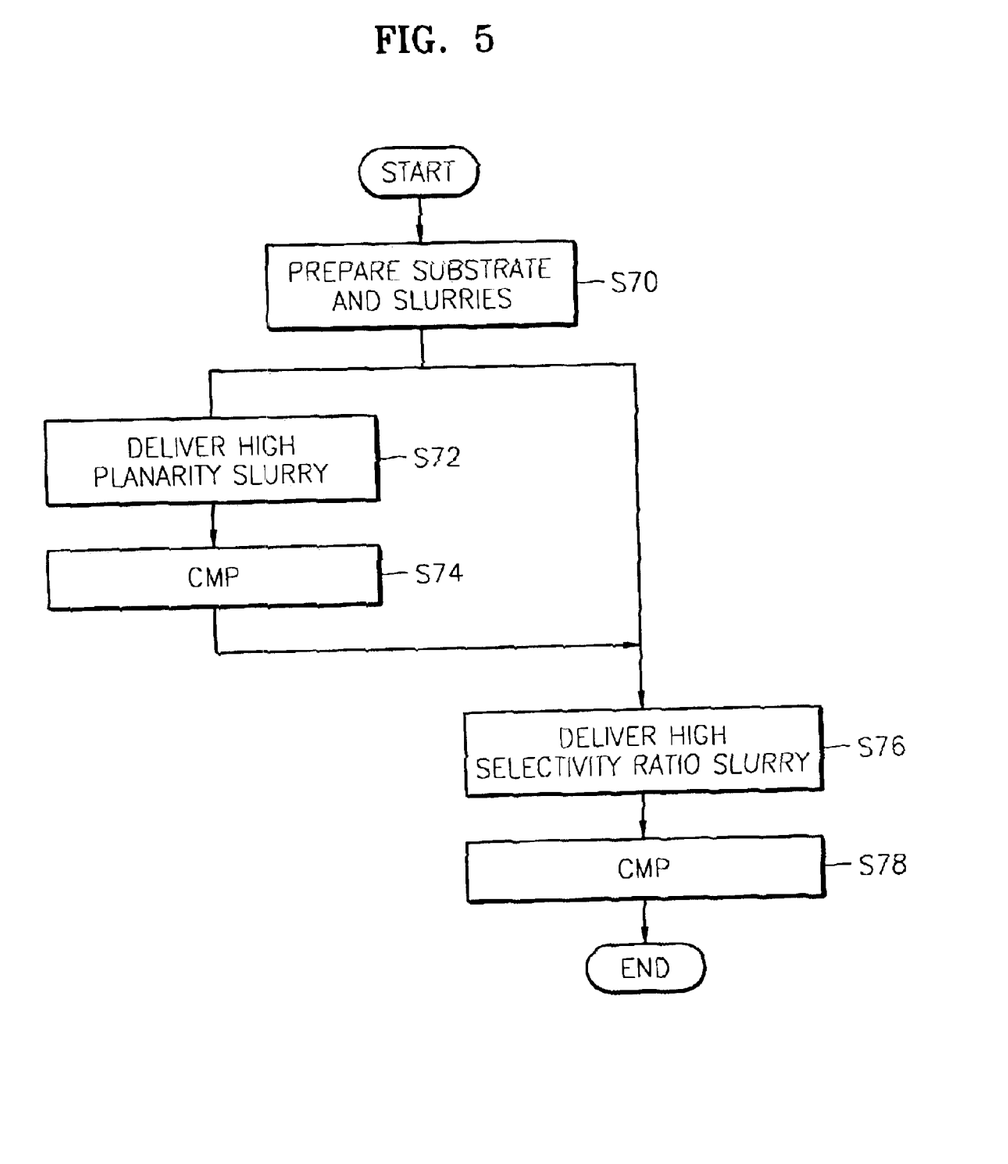
FIG. 5 is a flowchart illustrating a CMP method according to one aspect of the present invention.

CMP methods according to embodiments of the present invention will now be described in more detail with reference to FIGS. 4 and 5. Referring to FIG. 4, a polishing platen 40, having a polishing pad 41 on a surface thereof, is connected to a first rotation shaft 42 that is rotated by a motor (not shown). Above the polishing pad 41, a polishing head 50 is disposed and rotates by a second rotation shaft 52 that is rotated by a motor (not shown) in an opposite direction from the rotating direction of the polishing platen 40. A substrate 56 is fixed to the surface of the polishing head 50 using a clamp 54. A slurry delivery unit 60 delivers a slurry 62 to one side of the polishing platen 40.

A CMP process according to an embodiment of the invention will now be described in detail with reference to FIGS. 4 and 5. A substrate 56, which is to be planarized, and a slurry are prepared (S70). Then, the substrate 56 is attached to the polishing head 50 for delivery of the slurry 62.

If a target polishing layer formed on the substrate 56 is an interlevel dielectric (ILD), premetal dielectric (PMD), or intermetal dielectric (IMD) having large steps for covering lower structures, such as cell transistors, bit lines, and capacitors, a high planarity slurry 62 is preferably delivered (S72). Preferably, a high planarity slurry 62 includes about 0.2 to about 2.5 wt % of metal oxide abrasive particles and about 1.6 to about 4.0 wt % of an anionic polymer passivation agent.

When the substrate 56 and the polishing pad 41 are contacted, the substrate 56 and the polishing pad 41 rotate in opposite directions to polish/remove at least one portion of the ILD, PMD, or IMD layer (S74).

If the target polishing layer formed on the substrate 56 is an oxide layer burying a shallow trench, under which a silicon nitride layer stopper is formed, or the ILD layer in which self-aligned contact holes to be formed to expose the source/drain regions of a DRAM and under which the silicon nitride layer stopper is formed, a high selectivity ratio slurry is preferably delivered (S76) to remove at least one portion of the trench buried oxide layer or ILD layer (S78). Preferably, the high selectivity ratio slurry includes about 0.2 to about 2.5 wt % of metal oxide abrasive particles and about 0.4 to about 1.2 wt % of the anionic polymer passivation agent and quaternary amine.

In a case where the upper surface of the polishing stopper is used as the end point for polishing, the high planarity slurry is preferably delivered (S72) and CMP is performed to the portion of the polishing target layer (S74) to perform the preliminary planarization. Then, a slurry having a high selectivity ratio to the polishing stopper is delivered (S76), and CMP is performed (S78) to efficiently repress dishing and obtain an improved evenness on the substrate. As a result, a process margin is improved.

Various slurry mixtures according to embodiments of the invention will be described in further detail with reference to the following experiments.

Experimental Example 1

Figure 3:
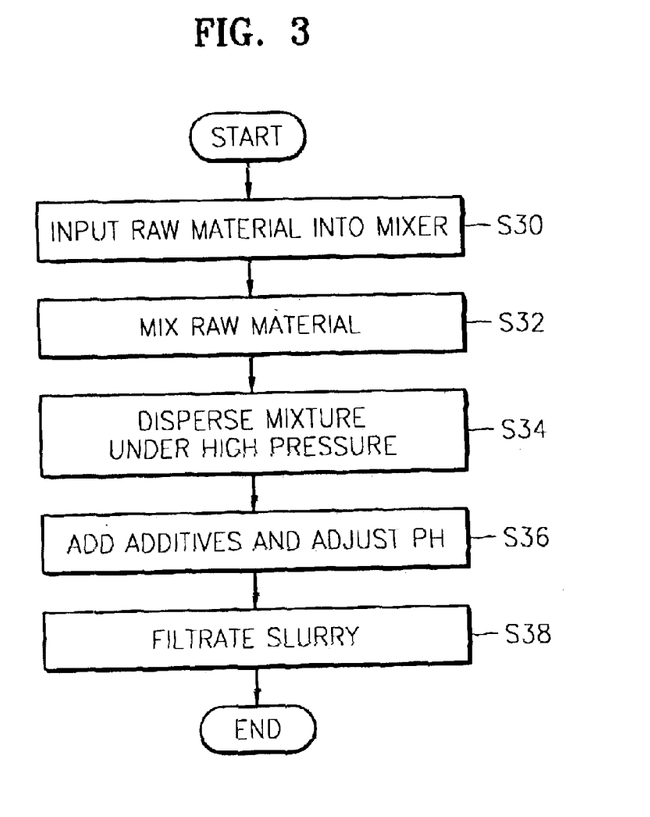
FIG. 3 is a flowchart illustrating a process for manufacturing a chemical mechanical polishing (CMP) slurry according to one aspect of the present invention.

In this experiment, using the method of FIG. 3, a plurality of slurries were prepared including 1 wt % of ceria as metal oxide abrasive particles and ammonium polycarboxylate (APC) as an anionic polymer passivation agent, while varying the content of the APC.

A blanket substrate having a PE-TEOS layer with a thickness of 10,000 Å and a blanket substrate having a silicon nitride layer ($Si_3N_4$) with a thickness of 20,000 Å were prepared as test samples.

Referring to Table 1, a CMP process was performed to the test samples using the slurries having varying amounts of APC, and the removal rate and oxide to nitride selectivity ratio was measured. In this case, CMP was performed under a down pressure of 4 psi and at a table speed of 77 rpm using Mirra equipment having an IC1000 upper pad and Suba4 subpad, which is manufactured by AMAT. The results are shown in Table 1, and FIG. 6 graphically illustrates the results in Table 1.

TABLE 1

| content of APC (wt. %) | removal rate (Å/min) | | selectivity ratio |
|---|---|---|---|
| | oxide layer (PE-TEOS) | silicon nitride layer ($Si_3N_4$) | |
| 0 | 4716 | 964 | 4.9:1 |
| 0.2 | 4868 | 91 | 53.3:1 |
| 0.4 | 4390 | 61 | 71.6:1 |

TABLE 1-continued

| content of APC (wt. %) | removal rate (Å/min) | | selectivity ratio |
| --- | --- | --- | --- |
| | oxide layer (PE-TEOS) | silicon nitride layer ($Si_3N_4$) | |
| 0.6 | 3940 | 65 | 60.8:1 |
| 0.8 | 3886 | 72 | 54.2:1 |
| 1.2 | 3526 | 78 | 45.1:1 |
| 2.0 | 310 | 73 | 4.3:1 |

Figure 6:
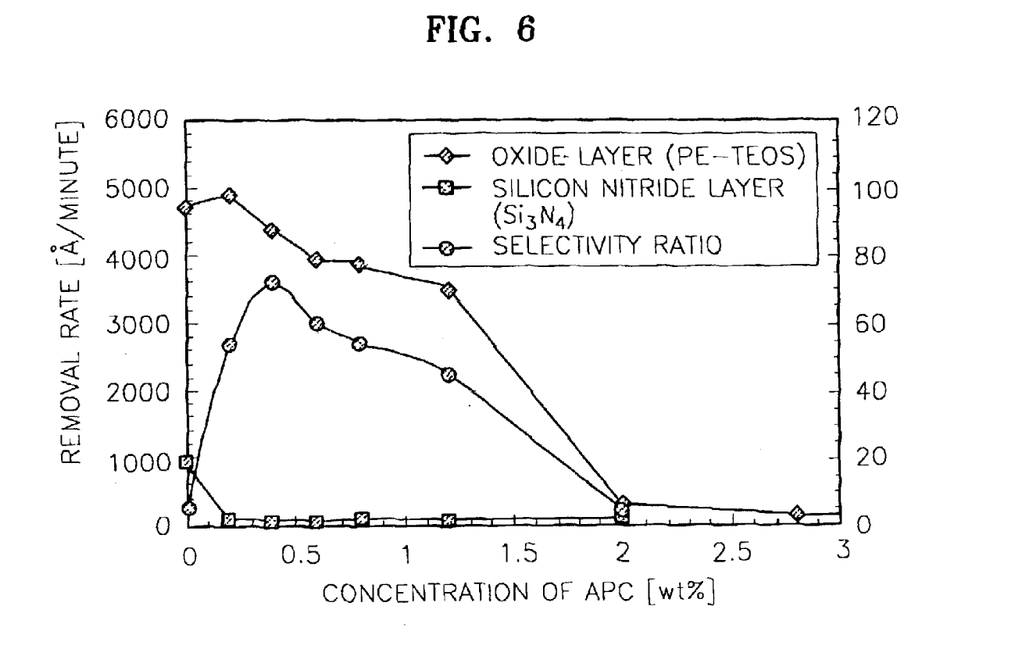
FIG. 6 is a graph illustrating removal rates and selectivity ratio of a silicon nitride layer and an oxide layer as a function of the content of an anionic polymer passivation agent.

As shown in Table 1 and FIG. 6, when APC is not included in the slurry, the removal rate of the silicon nitride layer is the highest (about 964 Å/min), and the selectivity ratio is as low as 4.9:1. When 0.2 wt % of APC is added to the slurry, the removal rate of the oxide layer is not seriously changed, but the removal rate of the silicon nitride layer is remarkably reduced, which indicates an improvement of the selectivity ratio. This is due to the anionic polymers 20 that are formed by being disassociated in the slurry, which selectively passivate the surface of the silicon nitride layer 15 to prevent the removal of the silicon nitride layer 15. Referring to FIG. 6, to obtain a high selectivity ratio over 45:1, an amount of about 0.2 to about 1.2 wt % of APC is preferably added. It is more preferable that an amount of about 0.4 to about 1.2 wt % of APC is added, based on a desired removal rate of the oxide layer.

When more than 1.6 wt % of APC is added, the removal rate of the silicon nitride layer is not changed remarkably but the removal rate of the oxide layer is suddenly reduced to 2000 Å/min. This is due to the excessive amount of APC that performs a selective passivation operation to the nitride layer while existing in a bulk phase which represses the activation of the abrasive particles and affects the fluidity of the slurry.

Experimental Example 2

In this experiment, using the method of FIG. 3, slurries were prepared by varying the amount of ceria metal oxide abrasive particles, 1 wt % and 5 wt %, while varying the concentrations of APC, 0 wt % and 0.8 wt %. An oxide layer (PE-TEOS) blanket substrate and a silicon nitride layer ($Si_3N_4$) blanket substrate (the same substrates as those used in Experimental Example 1) were prepared as test samples. CMP was performed on the test samples using the prepare slurries and the results are shown in Table 2.

TABLE 2

| ceria (wt. %) | APC (wt. %) | removal rate (Å/min) | | selectivity ratio |
| --- | --- | --- | --- | --- |
| | | oxide layer (PE-TEOS) | silicon nitride layer ($Si_3N_4$) | |
| 1 | 0 | 4716 | 954 | 4.9:1 |
| | 0.8 | 4618 | 89 | 52.2:1 |
| 5 | 0 | 8372 | 1686 | 5.0:1 |
| | 0.8 | 6869 | 108 | 63.5:1 |

As shown in Table 2, as the content of the abrasive particles increases, the removal rates of the oxide layer and silicon nitride layer increase, and a low selectivity ratio for the case with no added APC is under 5:1. When an amount of 0.8 wt % of APC is added to the slurry, the removal rate of the silicon nitride layer is suddenly reduced, thus increasing the selectivity ratio to over 50:1. In contrast, the removal rate of the oxide layer slowly increases when the content of the abrasive particles increases. When APC is included in the slurry, as the content of the abrasive particles increases, the increase in the removal rate of the oxide layer is more significant than the increase in the removal rate of the nitride layer, thereby the selectivity ratio increases. However, since the production cost of the slurry largely depends on the content of the abrasive particles, it is preferable that the content of the abrasive particles is minimized while obtaining a selectivity ratio of 45:1 by adding APC. As a result, it is preferable that an amount of about 0.2 to about 2.5 wt %, and more preferably about 0.5 to about 2.0 wt %, of the abrasive particles is included in the slurry.

Experimental Example 3

In this experiment, using the method of FIG. 3, a plurality of slurries were prepared including 1 wt % of ceria and 1 wt % of APC, while adjusting the pH of the slurries to 7.5 by adding basic additives, such as KOH, TMAH, and choline. The test samples prepared were the same as those in Experimental Example 1.

After performing a CMP process using the prepared slurries and test samples, the oxide to nitride selectivity ratios were measured. In this case, the CMP process was performed under a down pressure of 5 psi and at a table speed of 65 rpm using equipment having an IC1000 upper pad and Suba4 sub pad, which is manufactured by Presi. The results are illustrated in Table 3.

TABLE 3

| basic additive | pH of slurry | selectivity ratio |
| --- | --- | --- |
| None | 7.2 | 1 |
| KOH | 7.5 | 1.08 |
| TMAH | 7.5 | 1.17 |
| Choline | 7.5 | 1.18 |

(Note: the selectivity ratios in Table 3 are normalized values when a selectivity ratio without the basic additive, which is 50:1, is taken for 1)

When a base is added to the slurries having a high selectivity ratio to the silicon nitride layer by adding APC, the selectivity ratio additionally increases. It occurs because the added base promotes the disassociation of APC as shown in Equation 2 in FIG. 15b to form a large amount of anionic polymers that increase the passivation operation. Moreover, when a quaternary amine, such as TMAH or choline, is added, the selectivity ratio is effectively improved.

Experimental Example 4

In this experiment, using the method of FIG. 3, a plurality of slurries were prepared including 1 wt % of ceria and 1 wt % of APC, while varying the content of choline. The test samples prepared were the same as those in Experimental Example 1 were prepared.

Figure 7:
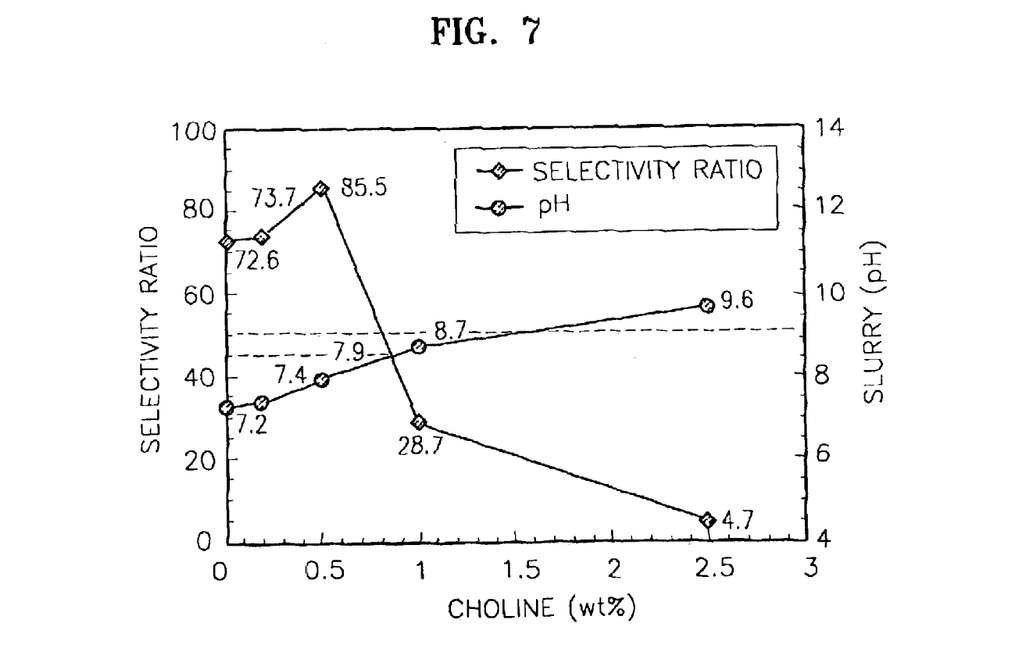
FIG. 7 is a graph illustrating selectivity ratio and the pH of the slurry as a function of the content of a quaternary amine.

After performing a CMP process using the prepared slurries and test samples, the removal rates of an oxide layer and silicon nitride layer and the oxide to nitride selectivity ratios were measured. In this case, the CMP process was performed using the same equipment and conditions as those in Experimental Example 3. The results are illustrated in Table 4 and FIG. 7 graphically illustrates the results shown in Table 4.

TABLE 4

| choline (wt. %) | slurry pH | removal rate (Å/min) | | selectivity ratio |
| --- | --- | --- | --- | --- |
| | | oxide layer (PE-TEOS) | silicon nitride layer ($Si_3N_4$) | |
| 0 | 7.2 | 6530 | 90 | 72.5:1 |
| 0.2 | 7.5 | 6340 | 86 | 73.7:1 |
| 0.5 | 8.0 | 6498 | 76 | 85.5:1 |
| 1.0 | 8.7 | 5966 | 208 | 28.7:1 |
| 2.5 | 9.6 | 5384 | 1150 | 4.7:1 |

As shown in Table 4, as the amount of choline increases, the selectivity ratio increases. However, when the amount of choline is over 1.0 wt %, the selectivity ratio suddenly falls. This occurs because when less than 1.0 wt % of the choline is added, the disassociation of APC is promoted to enhance the passivation of the silicon nitride layer. Moreover, the removal rate of the oxide layer increases by the oxide layer removal capacity of the choline. However, when over 1 wt % of the choline is added to the slurry, the pH of the slurry increases over 8 and suddenly reduces the selectivity ratio as shown in Table 4 and FIG. 7. The reason is that when the pH of the slurry increases over the isoelectric point of the silicon nitride layer, the surface of the silicon nitride layer is negatively charged. Therefore, a repulsive force exists between the negative charges formed by the disassociation of APC and the negatively charged silicon nitride layer to prevent passivation. As a result, it is preferable that the slurry includes about 0.1 to about 1.0 wt %, and more preferably about 0.2 to about 0.8 wt %, of quaternary amine, depending on the desired selectivity ratio.

Experimental Example 5

In this experiment, a high selectivity ratio slurry A including 1 wt % of ceria and 1.2 wt % of APC was prepared using the method of FIG. 3, and a conventional slurry B was prepared.

Figure 8:
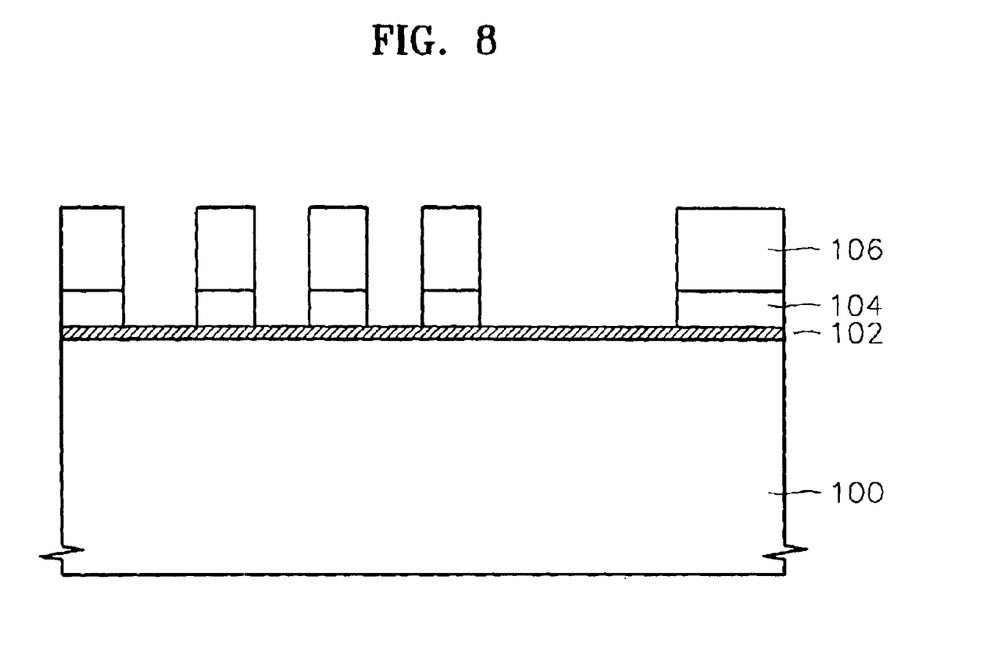
FIGS. 8, 9 and 10 are cross sectional views depicting processes for fabricating a test sample to which the slurry having a high selectivity ratio according to the present invention is applied.

Sample wafers, each comprising a total of 39 chips, were prepared using a STI process for 0.15 μm size static random access memory (SRAM). As shown in FIG. 8, a pad oxide layer 102 and silicon nitride layer were deposited on the overall surface of the wafer 100. In this case, a silicon nitride layer was formed by an LPCVD method, which uses dichloro silane and ammonia (NH₃) gas as reaction gases under a pressure of less than hundreds mTorr or a PECVD method at a high temperature of about 500 to 600° C. After forming a photoresist pattern 106, which defines trench regions, the silicon nitride layer was etched using the photoresist pattern 106 as an etch mask. Therefore, a silicon nitride layer pattern 104 was formed to operate as a hard mask and polishing stopper.

Figure 9:
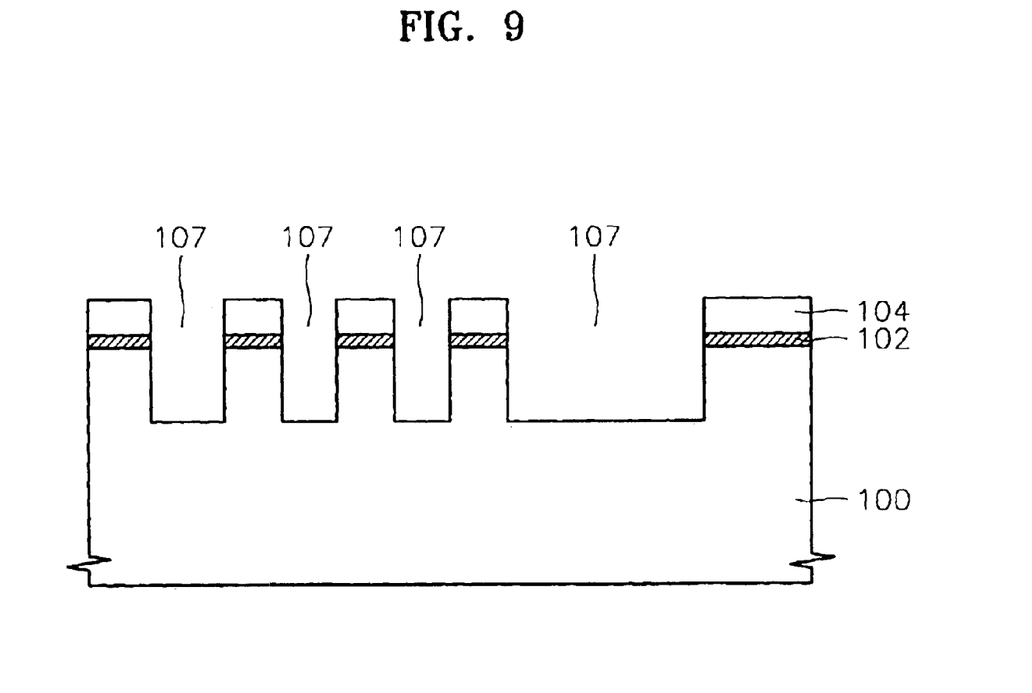

Referring to FIG. 9, the photoresist pattern 106 was removed, and the pad oxide layer 102 and the wafer 100 were etched using the silicon nitride layer pattern 104 as an etch mask to form a plurality of trenches 107.

Figure 10:
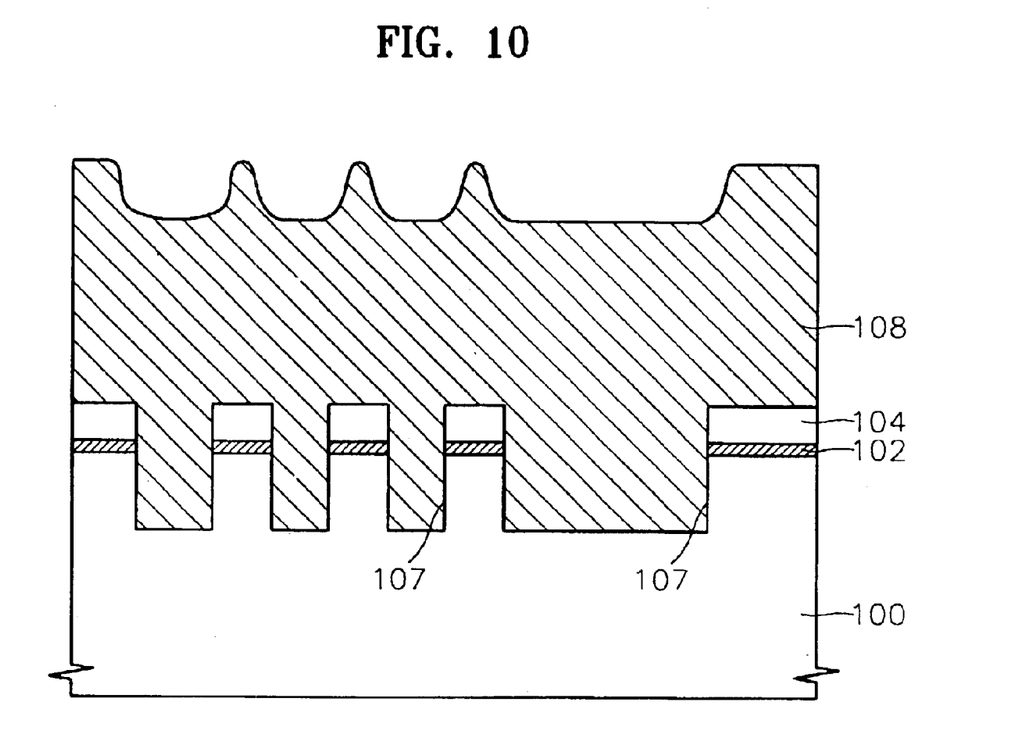

Referring to FIG. 10, an oxide layer 108 was formed to fill the trenches 107 and cover the surface of the silicon nitride layer pattern 104. In this case, the oxide layer 108 was a PE-TEOS layer, which was formed by the PECVD method.

Figure 11:
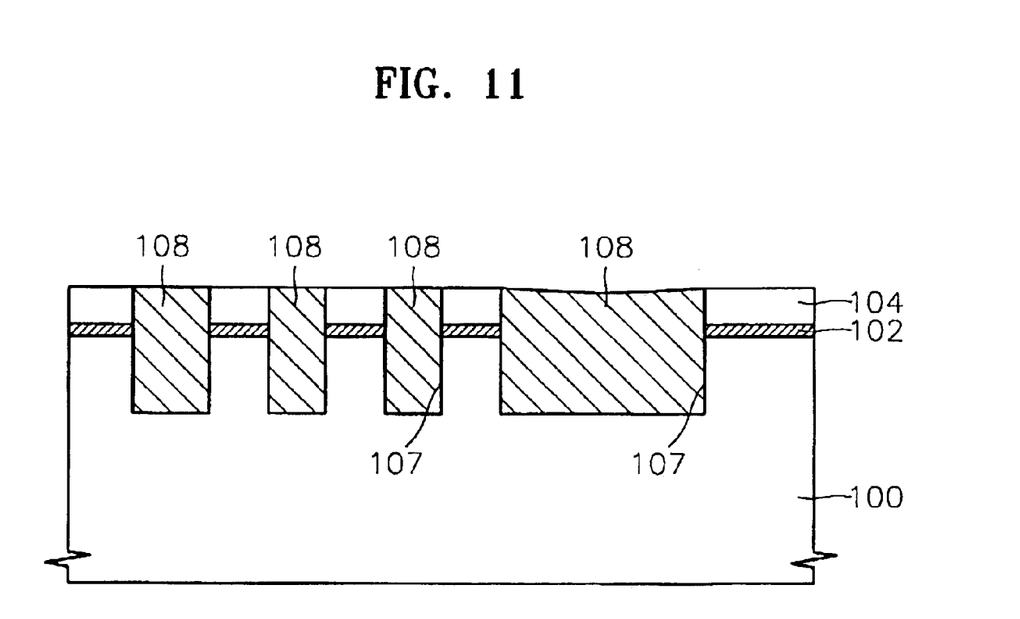
FIG. 11 is a cross sectional view depicting the test sample after application of CMP using a high selectivity ratio slurry according to the invention.
Figure 12:
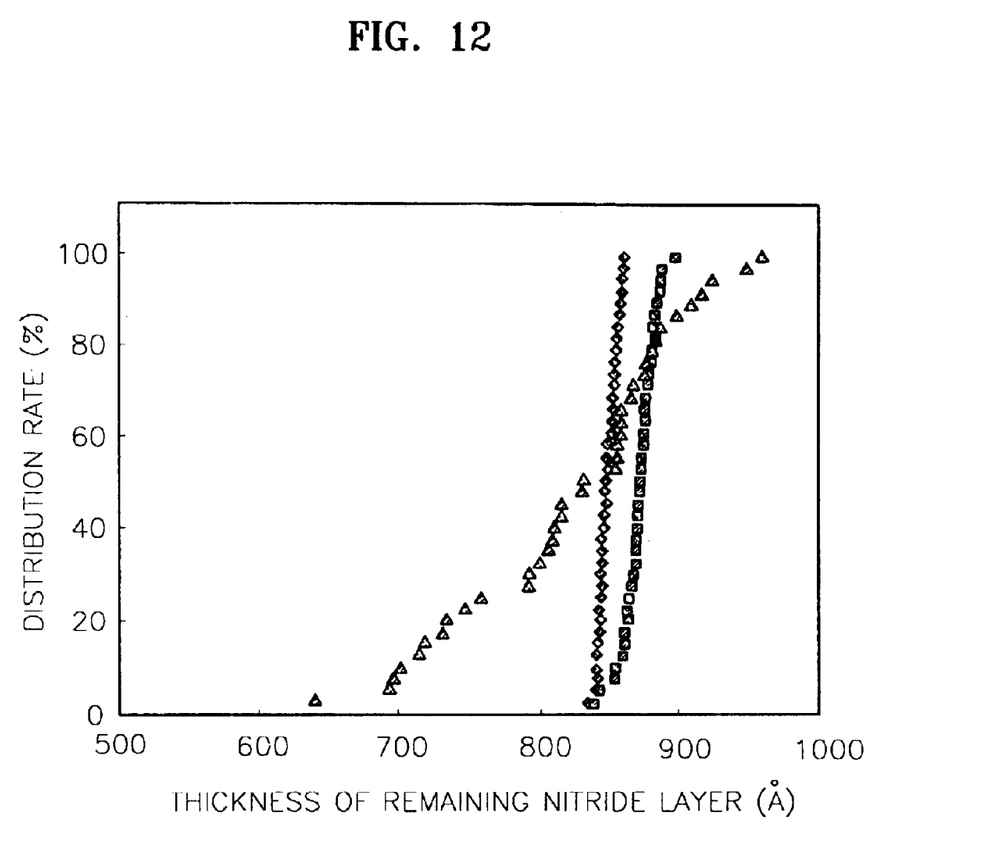
FIG. 12 is a graph illustrating distributions of thickness of remaining silicon nitride layers, after applying a conventional slurry and a slurry according to the present invention.

Then, a CMP process was performed using prepared slurries and sample wafers, while using the silicon nitride layer pattern 104 of the sample wafers as the polishing stopper. In this case, the CMP process was performed using 6ED equipment having an IC1000 upper pad and Suba 4 subpad, which is manufactured by Strasbaugh. FIG. 11 illustrates the result of the CMP process. The remaining thickness of the nitride layer pattern 104 as the polishing stopper were measured to obtain the average thickness, thickness deviation, and dishing depth in an area having a size of 100 μm by 100 μm. The results of these measurements are shown in Table 5. FIG. 12 illustrates the thickness of the nitride layer pattern 104 remaining after the CMP process. In FIG. 12, the square-shaped markers represent a first sample wafer, the diamond-shaped markers represent a second sample wafer, and the triangle-shaped markers represent a third sample wafer.

TABLE 5

| sample wafer | slurry | process condition (down pressure - table speed) | average thickness of remaining nitride layer pattern (Å) | thickness deviation of remaining nitride layer pattern (Å) | dishing depth (Å) |
| --- | --- | --- | --- | --- | --- |
| 1 | A | 6 psi - 45 rpm | 870 | 56 | 478 |
| 2 | A | 9 psi - 45 rpm | 848 | 22 | 820 |
| 3 | B | 9 psi - 45 rpm | 821 | 315 | 600 |

Referring to Table 5 and FIG. 12, when slurry A according to the present invention is used, the thickness deviations of the nitride layer pattern are as low as 56 Å and 22 Å. In particular, when the slurry A is used under the process conditions of a down pressure of 9 psi and a table speed of 45 rpm, the thickness deviation of the nitride layer pattern is as low as 7% of the deviation in the case of using the conventional slurry B. As a result, the slurry A according to the present invention is a high selectivity ratio slurry. In addition, the slurry according to the present invention may minimize the dishing by controlling the CMP process condition.

Experimental Example 6

In this experiment, a slurry A including 1 wt % of ceria and 2.0 wt % of APC was prepared using the method of FIG. 3, and a conventional slurry B was prepared.

A sample wafer was prepared by forming a PE-TEOS layer having a thickness of 23,000 Å on an overall surface of a wafer of 0.12 μm size DRAM devices having an initial step of 14,000 Å by lower structures.

Then, a CMP process was performed on the sample wafer using the slurries. The CMP process was performed under a down pressure of 4 psi and at a table speed of 77 rpm using Mirra equipment having an IC1000 upper pad and Suba4 subpad, which is manufactured by AMAT. The results of the CMP process are shown in Table 6.

TABLE 6

| slurry | removal rate of PE-TEOS (Å/min) | thickness deviation of remaining oxide layer after CMP (Å) |
| --- | --- | --- |
| A | 645 | 1050 |
| B | 3200 | 4694 |

As shown in Table 6, although the removal rate of the PE-TEOS is lower when the slurry A is used according to the present invention than when the slurry B is used, the thickness deviation of the remaining oxide layer after the CMP process is remarkably small. In other words, slurry A efficiently removes portions having high steps to attain high planarity. As a result, by using the high planarity slurry according to the present invention, the deposition thickness of the oxide layer to be polished can be reduced due to the excellent planarity capacity, thereby improving a process performance and reducing cost for the deposition process.

Experimental Example 7

In this experiment, a high selectivity ratio slurry and a high planarity slurry were prepared using the method shown in FIG. 3. In this case, a high selectivity ratio slurry includes 1 wt % of ceria, 1 wt % of APC, and 0.6 wt % of choline, while maintaining a pH in a range of 7.6 and 8.0, and a high planarity slurry includes 1 wt % of ceria and 2 wt % of APC.

Sample wafers were prepared through a STI process for a 0.12 μm size DRAM. In this case, trenches 107 were formed using the method described in Experimental Example 5 while reducing the design rule. Then, an oxide layer 108 was formed to bury the trenches 107 to obtain the sample wafer as shown in FIG. 10.

Figure 13:
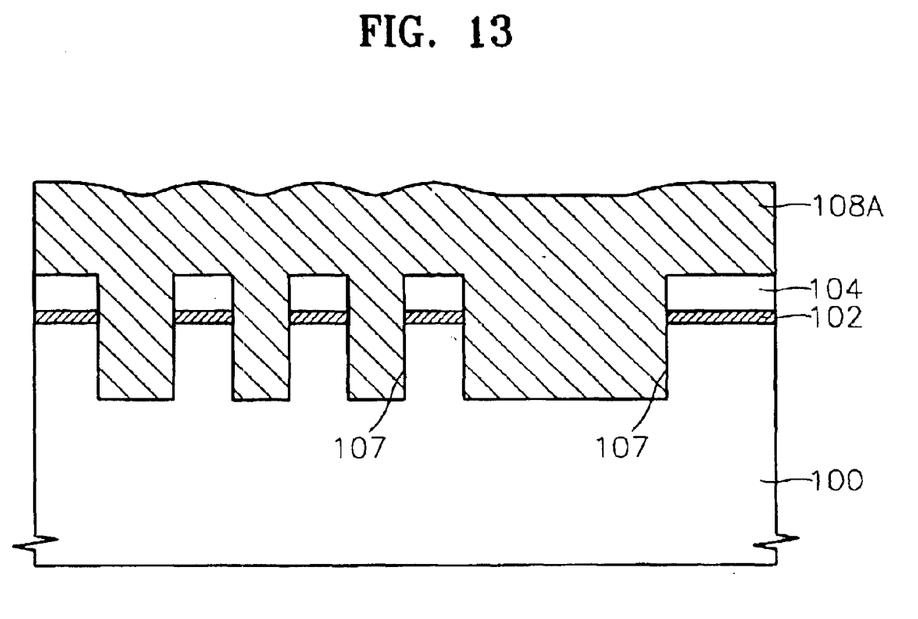
FIG. 13 is a cross sectional view depicting a test sample, which is preliminarily planarized using a high planarity slurry according to the invention.

Referring to FIG. 13, a pre-planarization CMP process was performed to leave an oxide layer having a thickness of 1500 Å on a polishing stopper 104 by using the high planarity slurry. In this case, the pre-planarization CMP process is performed under a down pressure of 4 psi and at a table speed of 77 rpm by using Mirra equipment having an IC1000 upper pad and Suba4 subpad, which is manufactured by AMAT.

Figure 14:
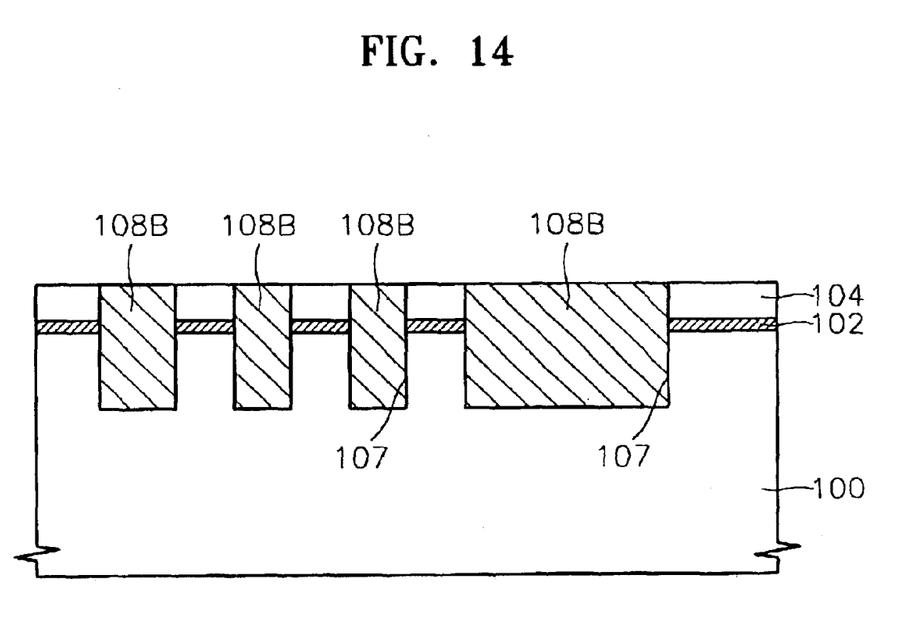
FIG. 14 is a cross sectional view depicting the preplanarized test sample to which a high selectivity ratio slurry is applied.

Then, a final CMP process was performed using the high selectivity ratio slurry. As a result, an STI process was completed as shown in FIG. 14.

On the other hand, a CMP process was performed on the other sample wafer having an oxide layer 108 with a thickness of 5500 Å, which was formed by an HDPCVD method, using a conventional slurry. In this case, the CMP process was performed under the down pressure of 4 psi and at the table speed of 77 rpm using Mirra equipment having the IC1000 upper pad and Suba4 subpad, which is manufactured by AMAT.

The thickness deviations of the remaining polishing stoppers and dishing depths at regions having a size of 100 μm by 100 μm on the sample wafers were measured after the CMP process. The results are shown in Table 7.

TABLE 7

| CMP method | deposition thickness of HDP oxide layer (Å) | thickness deviation of remaining polishing stopper (Å) | dishing depth (Å) |
| --- | --- | --- | --- |
| Conventional | 5500 | 55 | 630 |
| present invention (high planarity slurry + high selectivity ratio slurry) | 3800 | 65 | 567 |

As shown in Table 7, a CMP process according to the present invention removes most of the steps by the pre-planarization process and removes a remaining oxide layer 108A using a high selectivity ratio to the nitride polishing stopper 104. Accordingly, as shown in FIG. 14, the substrate is even and dishing is minimized. In addition, even if the oxide layer is deposited for a smaller thickness than the conventional oxide layer, the thickness of the remaining polishing stopper is not seriously changed and dishing is minimized.

In summary, high selectivity ratio and/or high planarity slurries are provided according to the present invention. When a high selectivity ratio slurry is used, the resulting wafer surface is even and dishing is not generated due to a small range of thickness deviation at the stopper. Accordingly, the margin for following processes after CMP in manufacturing devices is increased. In particular, in a case where the high planarity slurry is used in combination with the high selectivity ratio slurry so as to be applied to the CMP process of the substrate having the polishing stopper and the polishing target layer, the deposition thickness of the polishing target layer can be reduced and the evenness can be improved after the CMP process. In addition, a problem, such as dishing, can be prevented.

What is claimed is:

1. A slurry kit for chemical mechanical polishing (CMP) a substrate having a polishing stopper and a polishing target layer that covers the polishing stopper, the slurry kit comprising:

a first aqueous slurry including at least one type of metal oxide abrasive particle and an anionic polymer passivation agent in a first concentration; and a second aqueous slurry comprising the at least one type of metal oxide abrasive particle and the anionic polymer passivation agent in a second concentration, wherein the second concentration is less than the first concentration, wherein the second aqueous slurry has a pH (potential of hydrogen) in a range of about over an isoelectric point of the polishing target layer to about less than an isoelectric point of the polishing stopper.

2. The slurry kit of claim 1, wherein the passivation agent comprises one of polycarboxylic acid, polyethylenimine, polyvinyl sulfonic acid, polycarboxylate, polyethyleniminate, and polyvinyl sulfonate.

3. The slurry kit of claim 1, wherein the first slurry includes about 1.6 to about 4.0% by weight of the passivation agent based on the total weight of the first slurry, and the second slurry includes about 0.4 to about 1.2% by weight of the passivation agent based on the total weight of the second slurry.

4. The slurry kit of claim 3, wherein the first slurry includes about 1.6 to about 2.1% by weight of the passivation agent based on the total weight of the first slurry.

5. The slurry kit of claim 1, wherein the second slurry further comprises one of a quaternary amine, a salt thereof, and a derivative thereof.

6. The slurry kit of claim 5, wherein the quaternary amine comprises one of tetra methyl ammonium hydroxide and choline.

7. The slurry kit of claim 5, wherein the second slurry includes about 0.2 to about 0.8% by weight of the quaternary amine, the salt thereof, or the derivative thereof based on the total weight of the second slurry.

8. The slurry kit of claim 1, wherein the second slurry further includes a pH control agent.

9. The slurry kit of claim 8, wherein the pH control agent comprises one of potassium hydroxide, ammonium hydroxide, tetra methyl ammonium hydroxide, and choline.

10. The slurry kit of claim 1, wherein the abrasive particles comprises one of ceria, silica, alumina, titania, zirconia, germania, and any combination thereof.

11. The slurry kit of claim 1, wherein the first and second slurries comprise about 0.5 to about 2.0% by weight of the abrasive particles.

12. The slurry kit of claim 1, wherein the pH of the second slurry is in a range from about 5 to about 9.

13. The slurry kit of claim 12, wherein the pH of the second slurry is in a range from about 7 to about 9.

14. The slurry kit of claim 1, wherein the polishing target layer is an oxide layer and the polishing stopper is a silicon nitride layer.

15. The slurry kit of claim 14, wherein the oxide layer comprises a high density plasma chemical vapor deposition (HDPCVD) or plasma enhanced chemical vapor deposition (PECVD) oxide layer, and the silicon nitride layer comprises a low pressure chemical vapor deposition (LPCVD) or high temperature PECVD silicon nitride layer.

16. An aqueous slurry for chemical mechanical polishing a substrate having a polishing stopper and a polishing target layer that covers the polishing stopper, the aqueous slurry comprising:

metal oxide abrasive particles;

an anionic polymer passivation agent;

one of a quaternary amine, a salt thereof, and a derivative thereof; and a pH control agent, wherein the slurry maintains a pH in a range of about over an isoelectric point of the polishing target layer to about less than an isoelectric point of the polishing stopper, for selectively polishing the polishing target layer.

17. The slurry of claim 16, wherein the passivation agent comprises one of polycarboxylic acid, polyethylenimine, polyvinyl sulfonic acid, polycarboxylate, polyethyleniminate, and polyvinyl sulfonate.

18. The slurry of claim 16, wherein the slurry includes about 0.4 to about 1.2% by weight of the passivation agent based on the total weight of the slurry.

19. The slurry of claim 16, wherein the quaternary amine comprises one of tetra methyl ammonium hydroxide and choline.

20. The slurry of claim 16, wherein the slurry includes about 0.2 to about 0.8% by weight of one of the quaternary amine, the salt thereof, and the derivative thereof.

21. The slurry of claim 16, wherein the pH control agent comprises one of potassium hydroxide, ammonium hydroxide, tetra methyl ammonium hydroxide, and choline.

22. The slurry of claim 16, wherein the abrasive particles comprise one of ceria, silica, alumina, titania, zirconia, germania, and any combination thereof.

23. The slurry of claim 16, wherein the slurry includes about 0.5 to about 2.0% by weight of the abrasive particles based on the total weight of the slurry.

24. The slurry of claim 16, wherein the pH of the slurry is in a range from about 5 to about 9.

25. The slurry of claim 24, wherein the pH of the slurry is in a range from about 7 to about 9.

26. The slurry of claim 16, wherein the polishing target layer is an oxide layer and the polishing stopper is a silicon nitride layer.

27. The slurry of claim 26, wherein the oxide layer comprises an HDPCVD or PECVD oxide layer and the silicon nitride layer comprises an LPCVD or high temperature PECVD silicon nitride layer.

28. A method for chemical mechanical polishing (CMP), comprising the steps of:
removing at least a portion of a polishing target layer on the surface of a substrate having a polishing stopper and the polishing target layer that covers the polishing stopper by rotatably contacting the substrate to a polishing pad while delivering a first aqueous slurry to a gap between the substrate and the polishing pad, wherein the slurry comprises metal oxide abrasive particles and an anionic polymer passivation agent having a first concentration; and
rotatably contacting the substrate and polishing pad while delivering a second aqueous slurry to a gap between the substrate and the polishing pad, wherein the second aqueous slurry comprises the at least one type of metal oxide abrasive particle and the anionic polymer passivation agent in a second concentration, wherein the second concentration is less than the first concentration, wherein the second aqueous slurry has a pH (potential of hydrogen) in a range of about over an isoelectric point of the polishing target layer to about less than an isoelectric point of the polishing stopper, to thereby remove the polishing target layer until the surface of the polishing stopper is exposed.

29. The method of claim 28, wherein the polishing target layer is a trench buried dielectric or an interlayer dielectric formed on the substrate having lower structures.

30. The method of claim 28, wherein the polishing target layer is an oxide layer and the polishing stopper is a silicon nitride layer.

31. The method of claim 30, wherein the oxide layer comprises an HDPCVD or PECVD oxide layer and the silicon nitride layer comprises an LPCVD or high temperature PECVD silicon nitride layer.

32. The method of claim 28, wherein the passivation agent comprises one of polycarboxylic acid, polyethylenimine, polyvinyl sulfonic acid, polycarboxylate, polyethyleniminate, and polyvinyl sulfonate.

33. The method of claim 28, wherein the first slurry includes about 1.6 to about 4.0% by weight of the passivation agent based on the total weight of the first slurry, and the second slurry includes about 0.4 to about 1.2% by weight of the passivation agent based on the total weight of the second slurry.

34. The method of claim 28, wherein the second slurry further comprises one of a quaternary amine, a salt thereof, and a derivative thereof.

35. The method for CMP of claim 34, wherein the quaternary amine comprises one of tetra methyl ammonium hydroxide and choline.

36. The method of claim 34, wherein the second slurry includes about 0.2 to about 0.8% by weight of one of the quaternary amine, the salt thereof, and the derivative thereof.

37. The method of claim 28, wherein the second slurry further includes a pH control agent.

38. The method of claim 37, wherein the pH control agent comprises one of potassium hydroxide, ammonium hydroxide, tetra methyl ammonium hydroxide, and choline.

39. The method of claim 28, wherein the abrasive particles comprise ceria, silica, alumina, titania, zirconia, germania, and any combination thereof.

40. The method of claim 28, wherein the first and second slurries each include about 0.5 to about 2.0% by weight of the abrasive particles based on the total weight of the slurry.

41. The method of claim 28, wherein the pH of the second slurry is in a range from about 5 to about 9.

42. A method for chemical mechanical polishing (CMP), comprising the steps of:
rotatably contacting a substrate having a polishing stopper and a polishing target layer that covers the polishing stopper to a polishing pad while delivering an aqueous slurry, wherein the aqueous slurry comprises at least one kind of metal oxide abrasive particle, an anionic polymer passivation agent, one of quaternary amine, a salt thereof, and a derivative thereof, and a pH control agent, wherein the slurry has a pH in a range of about over an isoelectric point of the polishing target layer to about less than an isoelectric point of the polishing stopper for selectively polishing the polishing target layer, to thereby remove the polishing target layer until the surface of the polishing stopper is exposed.

43. The method of claim 42, wherein the polishing target layer is a trench buried dielectric or an interlayer dielectric formed on the substrate having lower structures.

44. The method of claim 42, wherein the polishing target layer is an oxide layer and the polishing stopper is a silicon nitride layer.

45. The method of claim 44, wherein the oxide layer comprises an HDPCVD or PECVD oxide layer and the silicon nitride layer comprises an LPCVD or high temperature PECVD silicon nitride layer.

46. The method of claim 42, wherein the passivation agent comprises one of polycarboxylic acid, polyethylenimine, polyvinyl sulfonic acid, polycarboxylate, polyethyleniminate, and polyvinyl sulfonate.

47. The method of claim 42, wherein the slurry includes about 0.4 to about 1.2% by weight of the passivation agent based on the total weight of the slurry.

48. The method of claim 42, wherein the quaternary amine comprises tetra methyl ammonium hydroxide and choline.

49. The method of claim 42, wherein the slurry includes about 0.2 to about 0.8% by weight of the quaternary amine, the salt thereof, and the derivative thereof based on the total weight of the slurry.

50. The method of claim 42, wherein the pH control agent comprises one of potassium hydroxide, ammonium hydroxide, tetra methyl ammonium hydroxide, and choline.

51. The method of claim 42, wherein the abrasive particles comprise ceria, silica, alumina, titania, zirconia, germania, and any combination thereof.

52. The method of claim 42, wherein the slurry includes about 0.5 to about 2.0% by weight of the abrasive particles based on the total weight of the slurry.

53. The method of claim 42, wherein the pH of the slurry is in a range from about 5 to about 9.

* * * * *